US011335652B2

(12) United States Patent
Vincent et al.

(10) Patent No.: US 11,335,652 B2
(45) Date of Patent: May 17, 2022

(54) METHOD, SYSTEM, AND APPARATUS FOR FORMING THREE-DIMENSIONAL SEMICONDUCTOR DEVICE PACKAGE WITH WAVEGUIDE

(71) Applicant: NXP USA, Inc., Austin, TX (US)

(72) Inventors: Michael B. Vincent, Chandler, AZ (US); Scott M. Hayes, Chandler, AZ (US); Zhiwei Gong, Chandler, AZ (US); Stephen Ryan Hooper, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 212 days.

(21) Appl. No.: 16/524,596

(22) Filed: Jul. 29, 2019

(65) Prior Publication Data

US 2021/0035927 A1 Feb. 4, 2021

(51) Int. Cl.

| | |
|---|---|
| ***H01L 23/66*** | (2006.01) |
| ***H01L 23/538*** | (2006.01) |
| ***H01L 21/48*** | (2006.01) |
| ***H01Q 1/22*** | (2006.01) |
| ***H01L 23/00*** | (2006.01) |

(52) U.S. Cl.

CPC .......... *H01L 23/66* (2013.01); *H01L 21/4846* (2013.01); *H01L 23/5386* (2013.01); *H01L 23/5387* (2013.01); *H01L 23/5389* (2013.01); *H01L 24/20* (2013.01); *H01Q 1/2283* (2013.01); *H01L 2223/6627* (2013.01); *H01L 2223/6677* (2013.01); *H01L 2224/214* (2013.01)

(58) Field of Classification Search

CPC ....... H05K 2201/058; H05K 2201/046; H05K 2201/042; H01L 21/4846; H01L 23/5386; H01L 23/5389; H01L 24/20; H01L 23/66; H01L 2223/6677; H01L 2223/6627; H01L 23/5387; H01Q 1/2283

See application file for complete search history.

(56) References Cited

U.S. PATENT DOCUMENTS

| | | | |
|---|---|---|---|
| 5,912,598 | A | 6/1999 | Stones et al. |
| 6,958,662 | B1 | 10/2005 | Salmela et al. |
| 7,276,987 | B2 | 10/2007 | Koriyama |
| 7,289,069 | B2 | 10/2007 | Ranta |
| 9,202,162 | B2 | 12/2015 | Gordon et al. |
| 9,219,041 | B2 | 12/2015 | Elad et al. |
| 9,272,370 | B2 | 3/2016 | Finn et al. |
| 9,356,352 | B2 | 5/2016 | Seok et al. |
| 9,548,255 | B1 | 1/2017 | Ge et al. |

(Continued)

OTHER PUBLICATIONS

Notice of Allowance dated Apr. 1, 2020 in U.S. Appl. No. 16/287,226.

(Continued)

*Primary Examiner* — Latanya N Crawford Eason

(57) ABSTRACT

A semiconductor device package that incorporates a waveguide usable for high frequency applications, such as radar and millimeter wave is provided. Embodiments employ a rigid-flex printed circuit board structure that can be folded to form the waveguide while, at the same time, mounting one or more semiconductor device die or packages. Embodiments reduce both the area of the mounted package and the distance signals need to travel between the semiconductor device die and antennas associated with the waveguide.

20 Claims, 14 Drawing Sheets

310

320

330

(56) References Cited

U.S. PATENT DOCUMENTS

| | | | |
|---|---|---|---|
| 9,743,885 | B1 | 8/2017 | Hao et al. |
| 10,103,447 | B2 | 10/2018 | Tong et al. |
| 2002/0114143 | A1 | 8/2002 | Morrison et al. |
| 2011/0180917 | A1 | 7/2011 | Tang |
| 2013/0062419 | A1 | 3/2013 | Finn et al. |
| 2019/0269009 | A1* | 8/2019 | Park ........................ H05K 1/036 |
| 2019/0288371 | A1* | 9/2019 | Kamgaing ........... H01Q 9/0457 |
| 2019/0372229 | A1* | 12/2019 | Dalmia ................ H01Q 9/0407 |
| 2021/0021046 | A1* | 1/2021 | Rashid ..................... H01Q 1/36 |

OTHER PUBLICATIONS

Notice of Allowance dated Jan. 15, 2021 in U.S. Appl. No. 16/446,861.

U.S. Appl. No. 16/287,226, filed Feb. 27, 2019, entitled “Package Integrated Waveguide”.

U.S. Appl. No. 16/446,861, filed Jun. 20, 2019, entitled “Package Integrated Waveguide”.

* cited by examiner 1100
1110
610
1115
1117
1120
610
1115
1130
610
1115
1140
610
1115
1117

METHOD, SYSTEM, AND APPARATUS FOR FORMING THREE-DIMENSIONAL SEMICONDUCTOR DEVICE PACKAGE WITH WAVEGUIDE

FIELD

This disclosure relates generally to semiconductor device packaging, and more specifically, to an efficient, cost-effective mechanism for forming a semiconductor device package incorporating a waveguide for an antenna launcher.

RELATED ART

Certain applications require the use of radio frequency (RF) active and passive components in an integrated circuit package. In such cases, it may be desirable to provide a RF coupling from the integrated circuit package to a device external to the IC package. Typical devices can provide a waveguide that is external to the integrated circuit package with electrical traces providing communication from the integrated circuit package to antenna structures associated with the waveguide.

Automotive radar and radio systems are requiring further miniaturization and integration for new applications. The traditional structures are too large and inherently incorporate resistance and signal degradation that can be unacceptable for higher frequency applications. While integrating the antenna into a semiconductor device package can reduce the overall size, waveguides are externally attached to the package and printed circuit board, affecting package board-level reliability.

It is therefore desirable to have a semiconductor device package that incorporates both the antenna and the waveguide into a small footprint structure (e.g., a package) that also eliminates or reduces a need for a PCB.

BRIEF DESCRIPTION OF THE DRAWINGS

Embodiments of the present invention may be better understood by referencing the accompanying drawings.

The use of the same reference symbols in different drawings indicates identical items unless otherwise noted. The figures are not necessarily drawn to scale.

DETAILED DESCRIPTION

Embodiments of the present invention provide a semiconductor device package that incorporates a waveguide usable for high frequency applications, such as radar and millimeter wave (mmWave). Embodiments employ a rigid-flex printed circuit board (PCB) structure that can be folded to form the waveguide while, at the same time, mounting one or more semiconductor device die or packages. Embodiments reduce both the area of the mounted package and the distance signals need to travel between the semiconductor device die and antennas associated with the waveguide.

Figure 1:
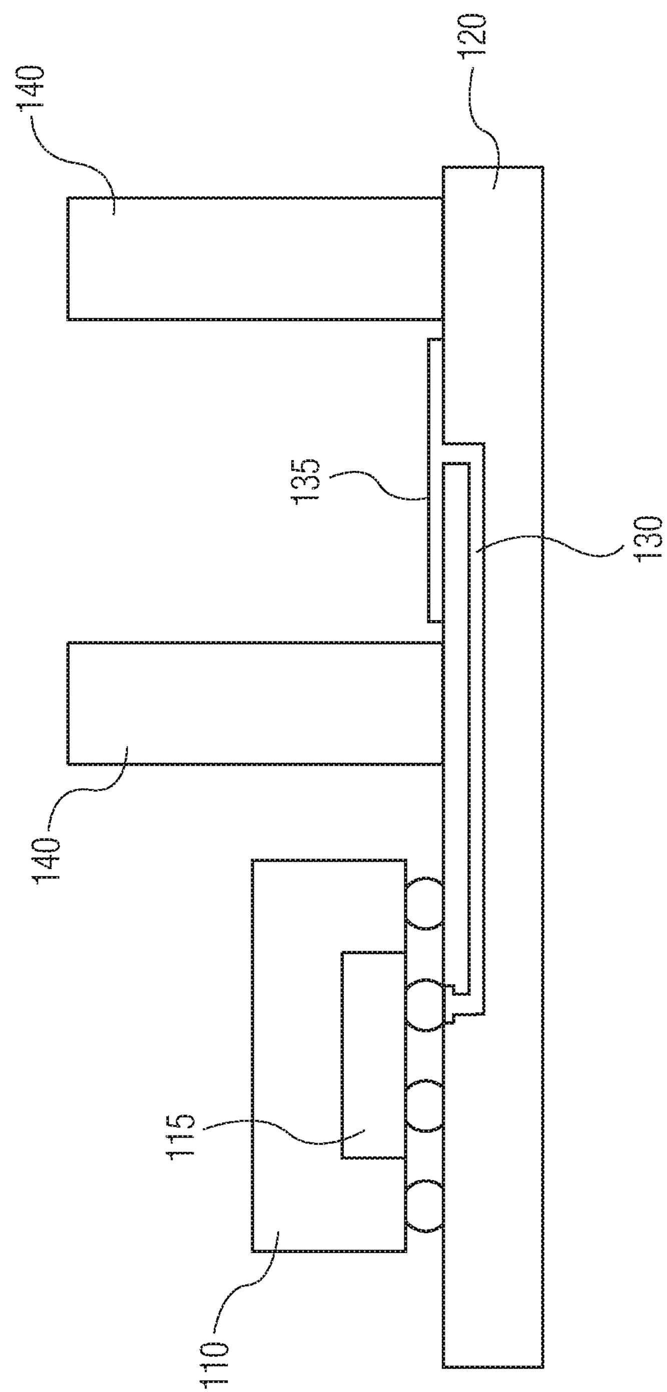
FIG. 1 is a simplified block diagram illustrating an example of a typical waveguide module incorporating a radio frequency die and antenna.

FIG. 1 is a simplified block diagram illustrating an example of a typical waveguide module incorporating a radio frequency (RF) die and antenna. Semiconductor device package 110 incorporates an RF die 115. Semiconductor device package 110 is electrically coupled to PCB board 120 that provides a metal trace 132 antenna 135. Antenna 135 has a waveguide 140 assembled in proximity to antenna 135. One disadvantage of the module in FIG. 1 is that there is a long signal path from RF die 115 to the antenna-waveguide structure, which contributes to impedance losses and therefore a reduction in RF efficiency. Further, this module is physically large due to the adjacent assembly of semiconductor device package 110 and the antenna-waveguide structure 140 on PCB 120. In addition, such a structure can be costly due to the use of expensive PCB material and additional assembly, often manual, of the waveguide structure.

While antenna-in-package concepts can shrink the area needed on the PCB illustrated in FIG. 1 by placing the antenna in the package, the waveguide structure becomes more complex. For example, the waveguide would be affixed to both the top of the package incorporating the antenna as well as the PCB. This can detrimentally affect package board level reliability.

In order to avoid space and connection length issues of traditional solutions for antenna-waveguide applications, embodiments of the present invention utilize a rigid-flex PCB structure to form a compact antenna and waveguide structure. As will be illustrated in greater detail below, the rigid-flex PCB structure is configured such that the PCB can be folded to form the waveguide along with providing a mounting position for a RF semiconductor device die or package. The folded rigid-flex PCB structure can then be mounted to another PCB for operational application.

Figure 2:
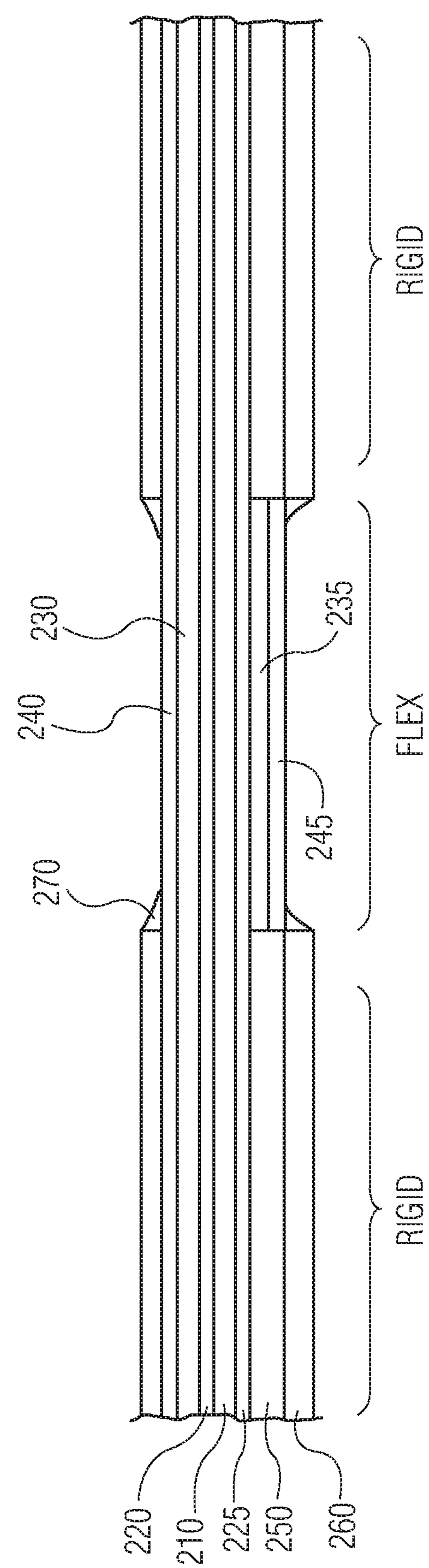
FIG. 2 is a simplified block diagram illustrating a cross-section of an example of a rigid-flex PCB, usable for embodiments of the present invention.

FIG. 2 is a simplified block diagram illustrating a cross-section of an example of a rigid-flex PCB, usable for embodiments of the present invention. A rigid-flex PCB is a combination of both flexible PCBs and rigid PCBs. Typically, the rigid PCBs carry all or the bulk of the components, while the flexible sections act as interconnections between the rigid sections.

Flex PCBs are created from a stack of flexible substrate material and metal, typically copper, laminated together with heat and pressure, and in some applications with adhesive. FIG. 2 provides a flexible substrate layer 210 in both the flex and rigid substrate regions. The most common flexible substrate materials are polyimide, polyester, and fluoropolymer. Polyimide has the highest dielectric constant and has good electrical and mechanical properties. A typical polyimide layer thickness is about 25 microns. Metal layers 220 and 225 are attached to flexible substrate layer 210. Metal layers 220 and 225 typically include copper which is rolled and annealed or sometimes wrought, with a thickness of about 17 microns. These forms of copper are produced as a foil and provide good flexibility. The flex substrate region also includes a coverlay film 240 and 245 made of polyimide, for example, and attached to the metal layers 220 and 225, respectively, by layers of coverlay adhesive 230 and 235, respectively.

The flexible substrate and adjacent metal layers extend from the flex substrate region to the rigid substrate regions. Instead of the flexible coverlay materials being attached, however, in the rigid regions one or more rigid dielectric layers are attached to the metal layers. In one example, a first dielectric layer can be a pre-preg fiberglass-epoxy laminate (e.g., layers 250) and a second dielectric layer can be a core material providing additional metal layers for traces (e.g., layers 260).

For embodiments of the present invention, some of the rigid substrate regions will include a metal layer 270 that will function as portion of a waveguide. Metal layer 270 can be a variety of metals, but typically will be copper grown or deposited using a variety of techniques such as CVD or PVD, or plated on the rigid dielectric. As illustrated, metal layer 270 is formed on the flex substrate coverlay surface in the rigid substrate regions of the rigid-flex PCB structure. Finally, an epoxy 270 is used in the surface regions where the flex substrate borders the rigid substrate. This is used, in part, to ease stresses in these regions when the flex substrate is subject to bending forces.

Figure 3:
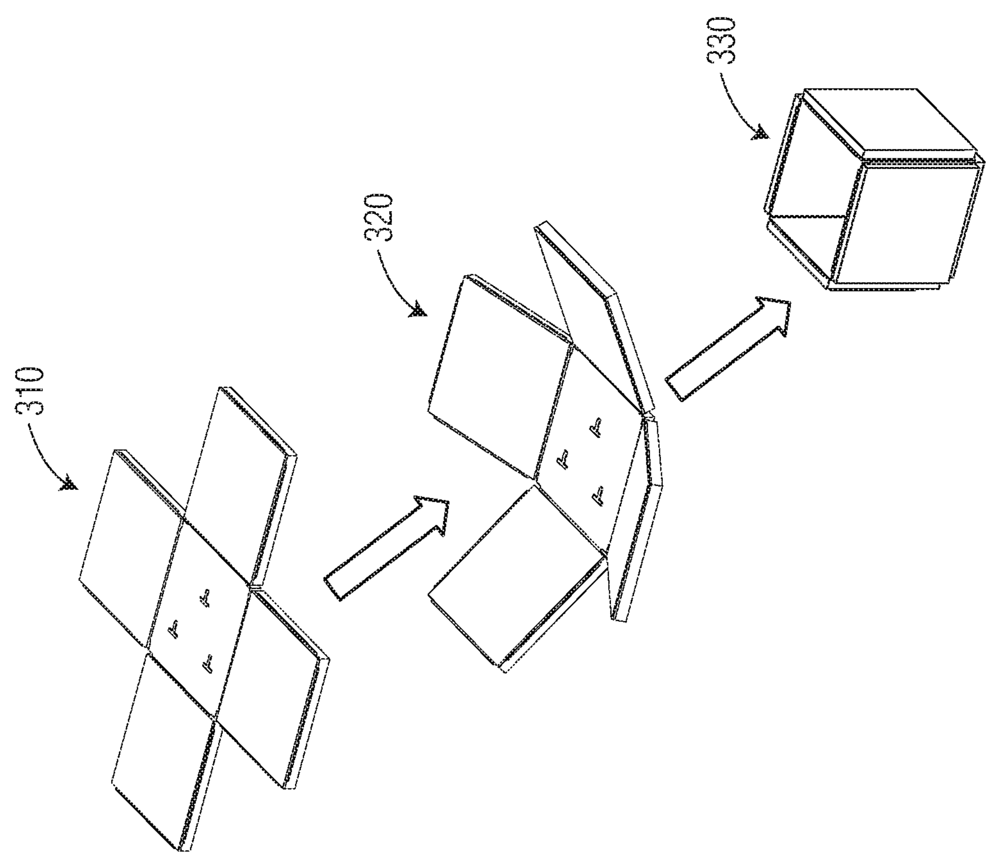
FIG. 3 is a simplified block diagram illustrating an example embodiment incorporating an integrated waveguide as part of a rigid-flex PCB structure, in accord with embodiments of the present invention.

FIG. 3 is a simplified block diagram illustrating an example embodiment incorporating an integrated waveguide as part of a rigid-flex PCB structure, in accord with embodiments of the present invention. A rigid-flex integrated waveguide structure at stage 310 is formed having a metallized major surface (e.g., copper) on a set of rigid PCB "petals" surrounding a non-metallized rigid PCB that can include one or more antenna launchers on the same major surface, where the antenna launchers are configured to introduce signals to the waveguide In one embodiment, the antenna launchers are patterned in metal layers on top of the PCB. As illustrated, there are four petals surrounding a rectangular center PCB, but embodiments are not limited to four-sided shapes for the center PCB. Flex PCB regions join each of the petals to the center rigid PCB, such that the petals can be folded toward the center PCB as in stage 320. Stage 330 illustrates a final box shape formed as all the petals are positioned orthogonal to a plane of the center rigid PCB. In this position, the petals can be adhesively coupled to permanently form the box shape in which the inner surface of the box is a metallized waveguide for the antenna launchers on the center rigid PCB.

Figure 4:
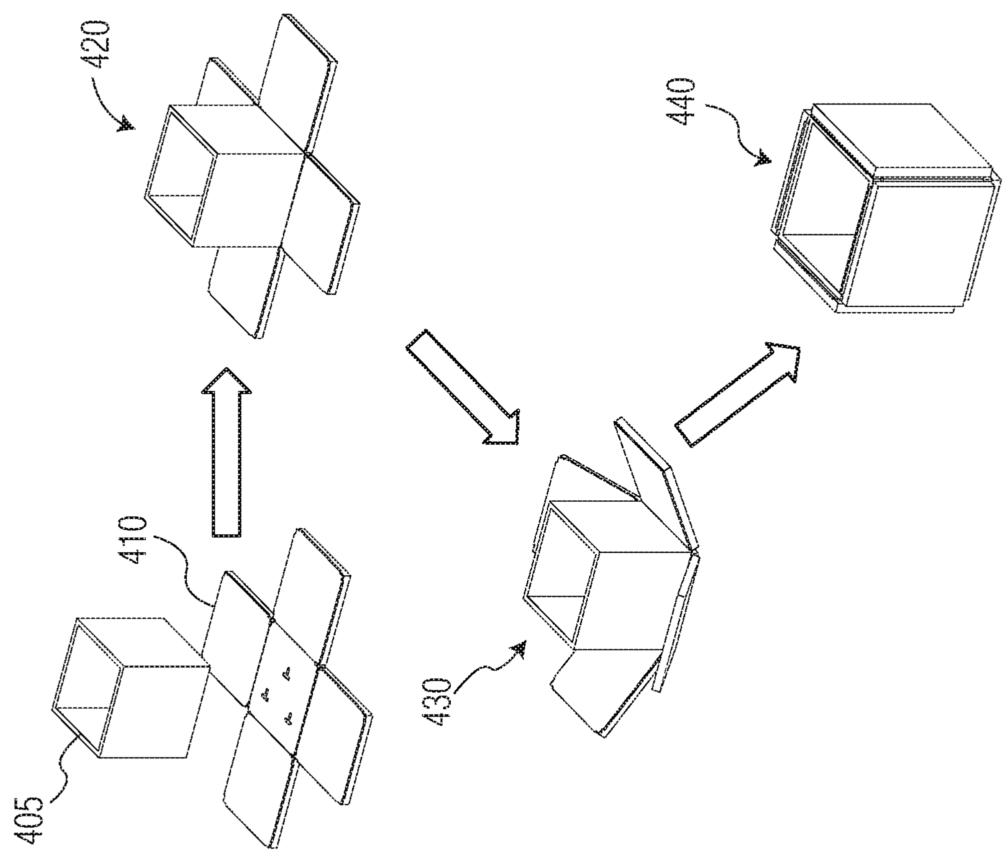
FIG. 4 is a simplified block diagram illustrating an alternative example embodiment for incorporating a prefabricated waveguide as part of a rigid-flex PCB structure, in accord with embodiments of the present invention.

FIG. 4 is a simplified block diagram illustrating an alternative example embodiment for incorporating a prefabricated waveguide as part of a rigid-flex PCB structure, in accord with embodiments of the present invention. A prefabricated conductive waveguide structure 405 is formed in a desired shape (e.g., a prism structure [here, a cube] having an open top and bottom, as illustrated). The entire prefabricated conductive waveguide structure can be a conductor, or just the inner surface can be coated with a conductor, to form the waveguide. A rigid-flex PCB structure 410 that has a center rigid PCB having an area such that an open end of waveguide structure 405 can be placed on the center rigid PCB. Rigid-flex PCB structure 410 further includes four rigid PCB "petals" surrounding the center rigid PCB, in a similar fashion to the structure illustrated in FIG. 3 but without metallizing the major surface. This is because the prefabricated conductive waveguide structure will function as the waveguide of the completed structure, instead of metallization of the rigid petals.

Prefabricated conductive waveguide structure 405 is placed on the center rigid PCB of rigid-flex PCB structure 410 at stage 420. At stage 430, the petals can be folded toward the prefabricated conductive waveguide structure at the flex PCB regions. Stage 440 illustrates a box shape being formed as all the petals are positioned orthogonally to a plane of the center rigid PCB and up against the outer walls of prefabricated conductive waveguide structure 405. In this position, the petals can be adhesively coupled to the prefabricated conductive waveguide structure or to each other to permanently form the box shape. Prefabricated conductive waveguide structure 405 can function as a waveguide for antenna launchers on the center rigid PCB of structure 410.

Figure 5:
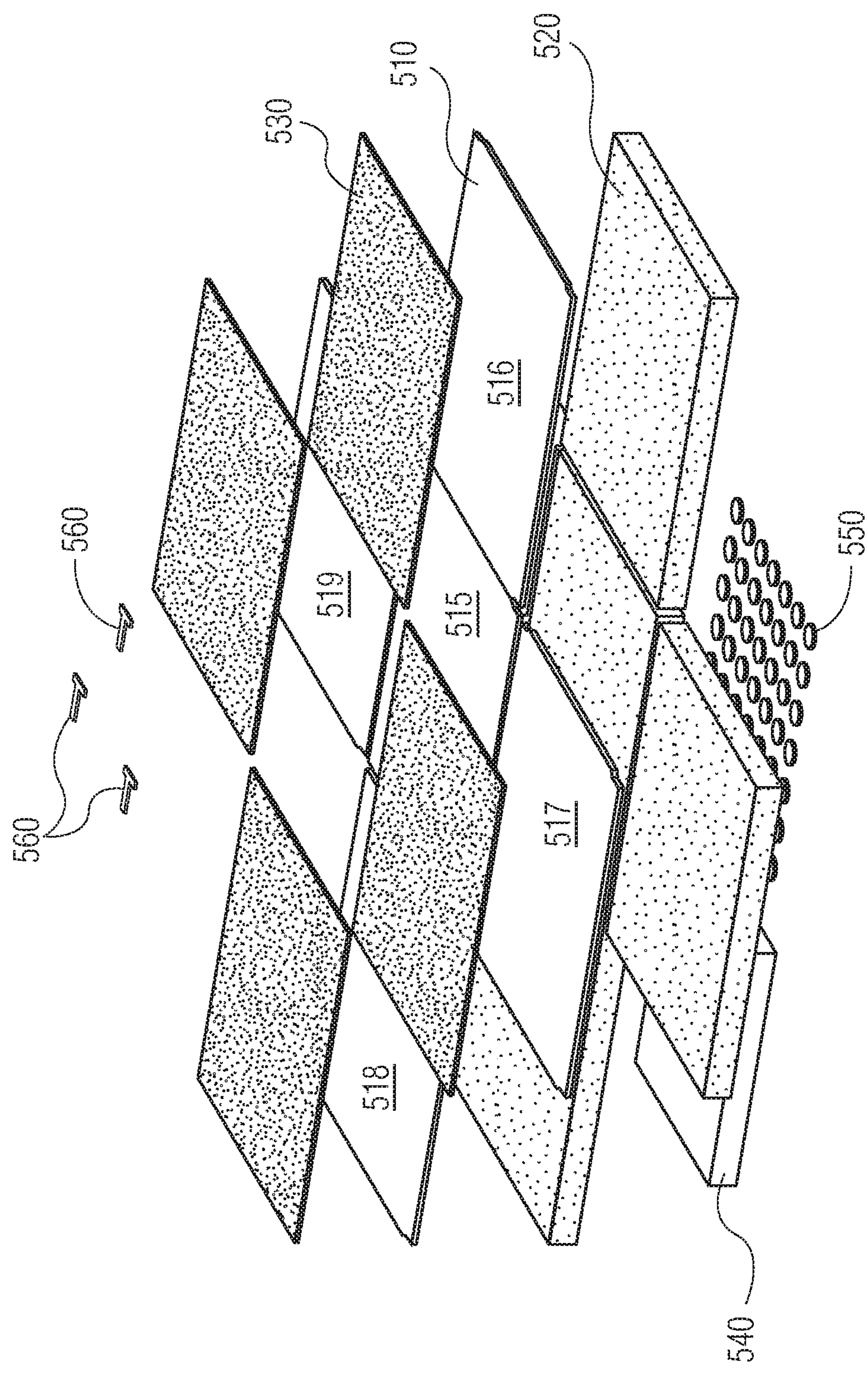
FIG. 5 is a simplified block diagram illustrating the layers included in an integrated waveguide rigid-flex PCB structure, in accord with one embodiment of the present invention.

FIG. 5 is a simplified block diagram illustrating the layers included in an integrated waveguide rigid-flex PCB structure, in accord with one embodiment of the present invention. Flex PCB substrate 510 is a foundation upon which the rigid-flex PCB structure is built. The flex PCB substrate is formed with a center region 515 surrounded by a set of petal regions 516, 517, 518, and 519 that can be flexibly folded around the center region. The embodiment illustrated provides a center region that is rectangular and petal regions flexibly attached to each edge of the rectangular center region. Rigid PCB substrate material 520 is formed or attached to one major surface of each section of flex PCB substrate 510. But the rigid PCB substrate material is not formed in the regions designed to be flexed to form the final structure (e.g., around the edges of the center region). A metal layer 530 is formed or attached to a major surface of each petal section of flex PCBs substrate 510 that opposes rigid PCB substrate material 520.

An active surface of semiconductor device die or package 540 can be attached to an available major surface of one of the rigid PCB substrates on a petal region. Input/output pads (not shown) on the active surface of semiconductor device die/package 540 can be communicatively coupled with traces on the major surface of the rigid PCB substrate. Some (up to and including all) of the plurality of input/output pads may carry either a radio frequency (RF) signal or may carry a non-RF signal (e.g., a power supply signal). The traces can couple the semiconductor device die/package to one or more of interconnect pads 550 (e.g., solder balls, solder paste, or conductive adhesive) or antenna launchers 560. For example, an RF signal can be carried by a conductive trace between semiconductor device die/package 540 and antenna launchers 560, where the RF signal can be transmitted from or received on the antenna launcher. Interconnect pads 550 can be coupled to traces on a major surface of the rigid PCB substrate material on the center region, thereby allowing the completed structure to be communicatively coupled to a larger device board. Antenna launchers 560 can be communicatively coupled to traces in flex substrate 510 in the center region. Embodiments can use metallized traces in the flex PCBs substrate to provide signal conductivity between semiconductor device die/package 540 and other components in the antenna-waveguide structure.

Figure 6A:
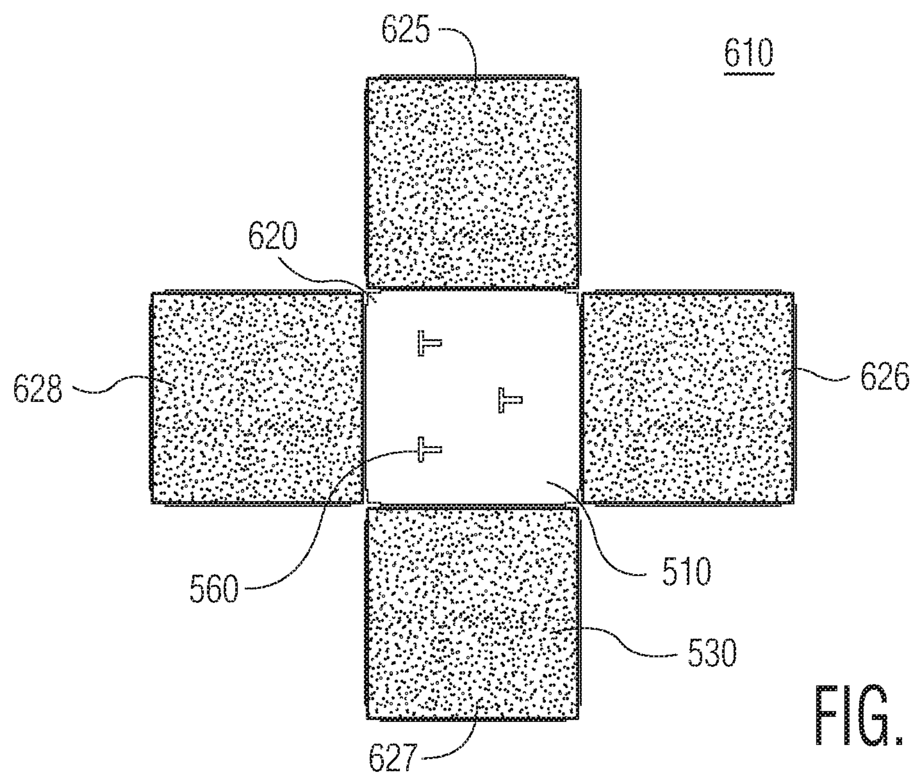
FIGS. 6A and 6B are simplified block diagrams illustrating a completed integrated waveguide rigid-flex structure in an unfolded configuration, in accord with an embodiment of the present invention.
Figure 6B:
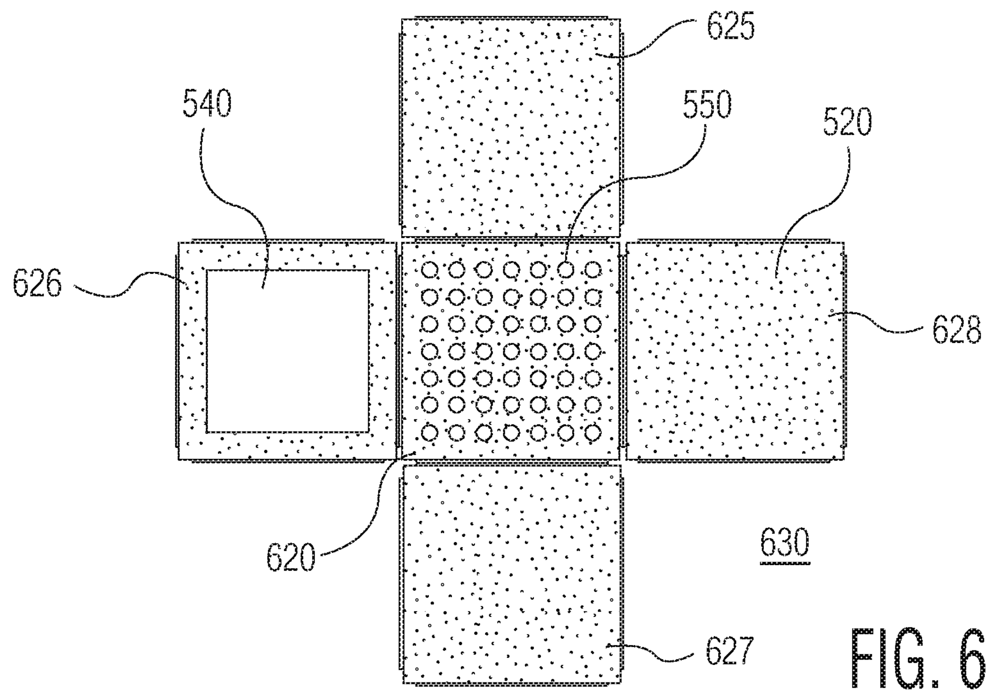

FIGS. 6A and 6B are simplified block diagrams illustrating a completed integrated waveguide rigid-flex structure in an unfolded configuration, in accord with an embodiment of the present invention. Upper plan view 610 in FIG. 6A illustrates center section 620 exposing a surface of flex PCB substrate 510 with antenna launchers 560 mounted thereon. In addition, petals 625, 626, 627, and 628 surrounding center section 620 are have an exposed surface of metal layer 530.

Lower plan view 630 in FIG. 6B illustrates center section 620 exposing a surface of rigid PCB substrate 520 with interconnect pads 550 mounted thereon. Each petal 625, 626, 627, and 628 is illustrated with an exposed surface of rigid PCB substrate 520. Petal 626 is further illustrated with semiconductor device die or package 540 mounted thereon.

Figure 7A:
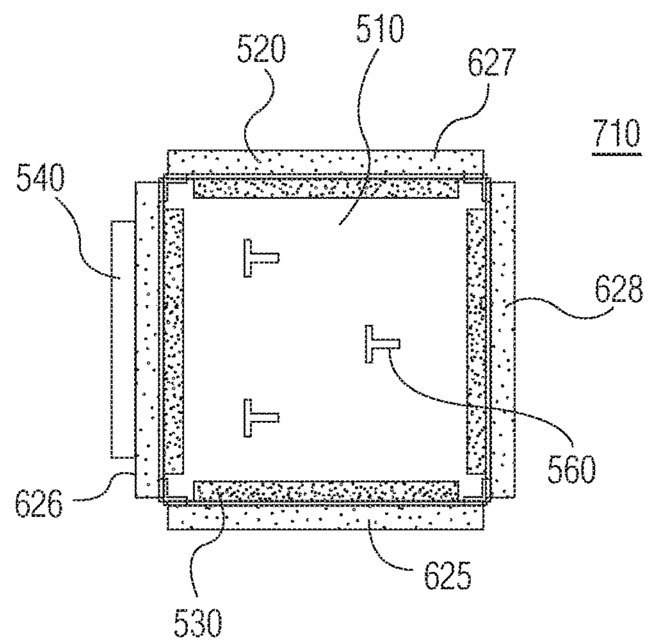
FIGS. 7A and 7B are simplified block diagrams illustrating the completed integrated waveguide rigid-flex structure in a folded configuration, in accord with an embodiment of the present invention.
Figure 7B:
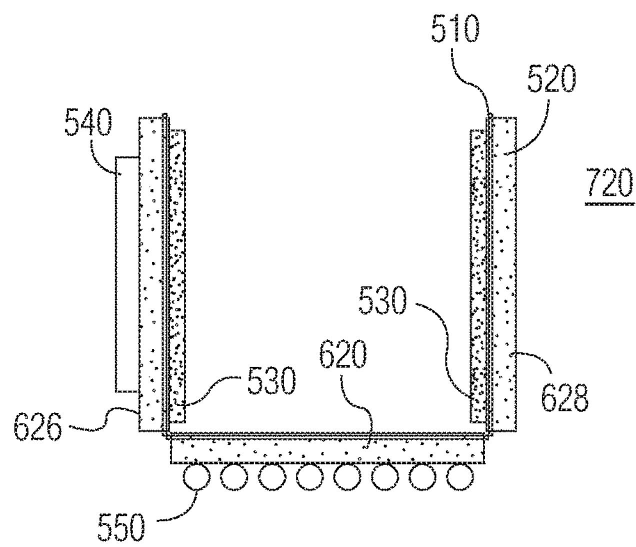

FIGS. 7A and 7B are simplified block diagrams illustrating the completed integrated waveguide rigid-flex structure of FIGS. 6A and 6B in a folded configuration, in accord with an embodiment of the present invention. Upper plan view 710 in FIG. 7A illustrates the folded side petals 625, 626, 627, and 628, once joined together at the corners, forming a box around antenna launchers 560. Metal layer 530, attached to the petals, forms a waveguide as the inner surface of the box. Semiconductor device die/package 540 is attached to one of the sides of the box now orthogonal to the center section. The set of petals can be adhesively coupled to one another using an adhesive or soldering, depending upon the application.

Cross-section view 720 in FIG. 7B illustrates petals 626 and 628 raised to a position orthogonal to center section 620. Petal 626 includes semiconductor device die or package 540 mounted thereon. Further, a set of interconnect pads 550 attached to the bottom major surface of the center section.

Figure 8:
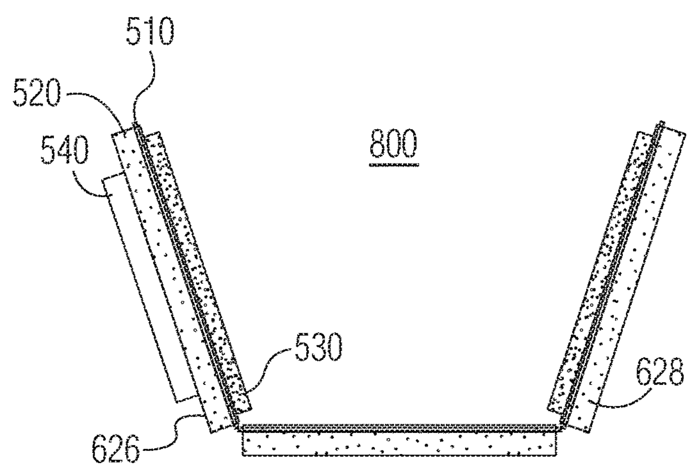
FIG. 8 is a cross-section view of an alternate folded embodiment using the integrated waveguide rigid-flex structure, in accord with an embodiment of the present invention.

FIG. 8 is a cross-section view 800 of an alternate folded embodiment using the structure illustrated in FIG. 6, in accord with an embodiment of the present invention. Rather than folding petal 626 and 628 to a position orthogonal to the center section, the petals are folded to an open angle relative to the center section. In this manner, embodiments provide flexibility as to the nature of the waveguide structures formed.

Figure 9C:
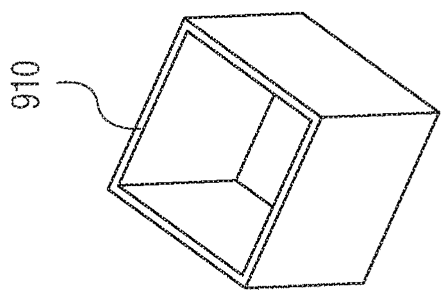
FIGS. 9A, 9B, and 9C are simplified block diagrams illustrating a completed prefabricated waveguide rigid-flex structure in an unfolded configuration, in accord with an embodiment of the present invention.
Figure 9B:
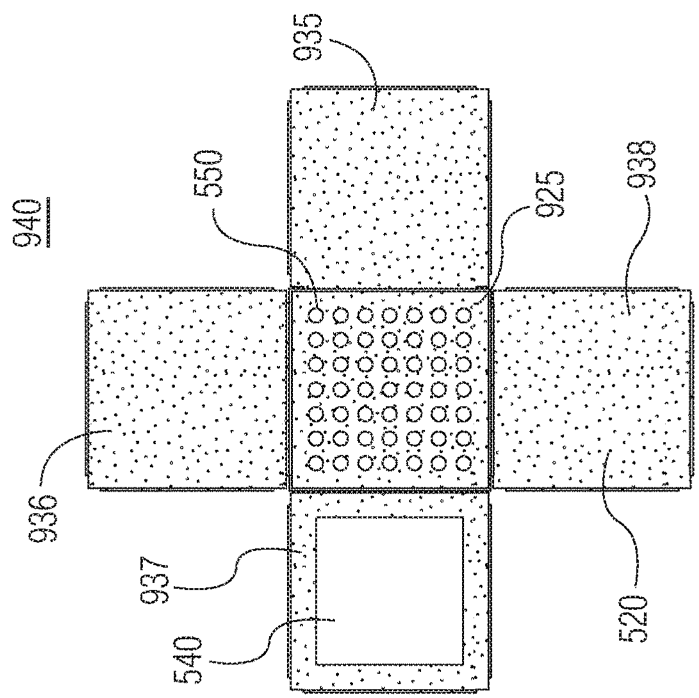
Figure 9A:
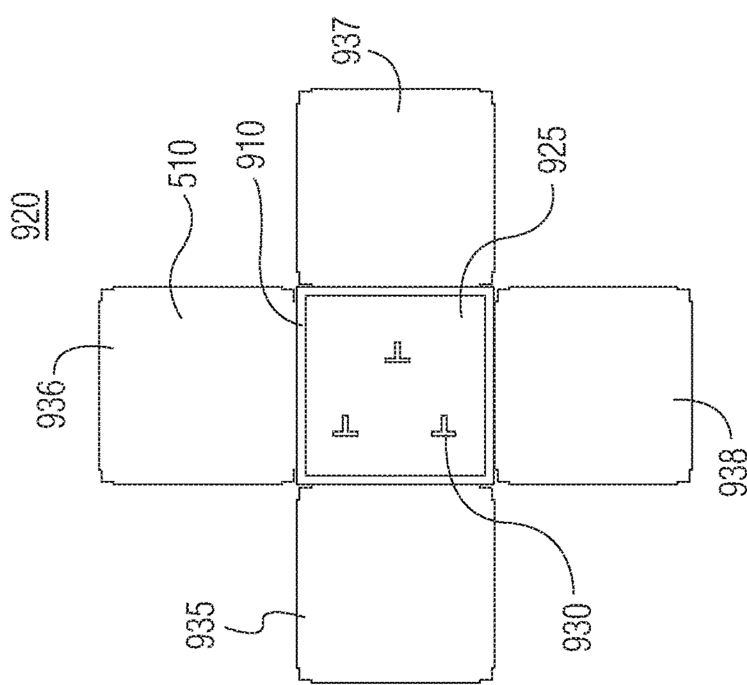

FIGS. 9A-9C are simplified block diagrams illustrating a completed prefabricated waveguide rigid-flex structure in an unfolded configuration, in accord with an embodiment of the present invention. As discussed above, a metal waveguide structure 910 (FIG. 9C) can be pre-formed for use with the rigid-flex structures of the present invention. Upper plan view 920 in FIG. 9A illustrates a center section 925 shaped to accommodate metal waveguide structure 910, which surrounds the center section surface area including antenna launchers 930. Petals 935, 936, 937, and 938 are formed surrounding center section 925 of flex PCB substrate 510. Lower plan view 940 in FIG. 9B illustrates center section 925 exposing a surface of rigid PCB substrate 520 with interconnect pads 550 mounted thereon. Each petal 935, 936, 937, and 938 is illustrated with an exposed surface of rigid PCB substrate 520. Petal 937 is further illustrated with semiconductor device die or package 540 mounted thereon.

Figure 10A:
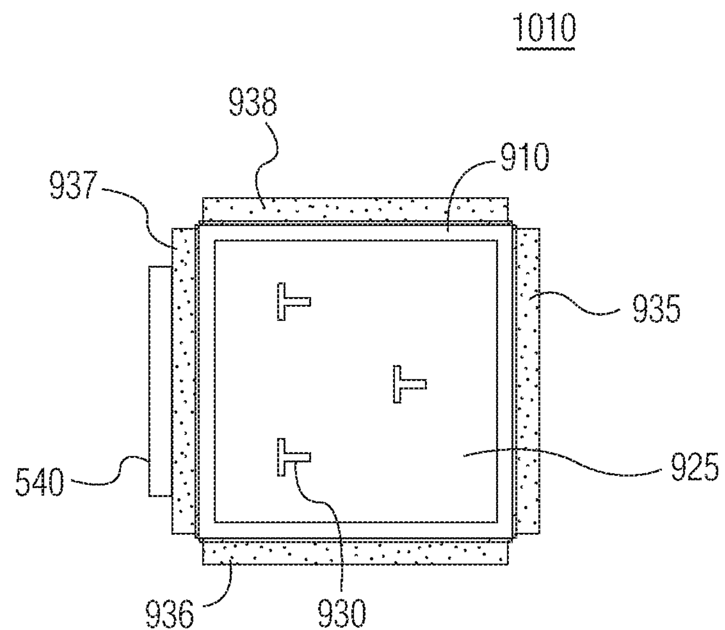
FIGS. 10A and 10B are simplified block diagrams illustrating the completed prefabricated waveguide rigid-flex structure in a folded configuration, in accord with an embodiment of the present invention.
Figure 10B:
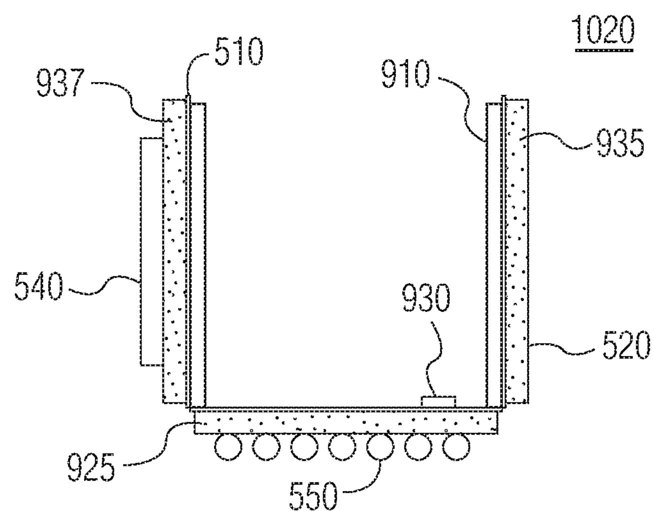

FIGS. 10A and 10B are simplified block diagrams illustrating the completed prefabricated waveguide rigid-flex structure of FIGS. 9A-9C in a folded configuration, in accord with an embodiment of the present invention. Upper plan view 1010 in FIG. 10A illustrates how the folded side petals joined together at the corners, together with prefabricated conductive waveguide structure 910, form the waveguide for antenna launchers 560.

Cross-section view 1020 in FIG. 10B illustrates petals 937 and 935 raised around metal waveguide structure 910. Further, interconnect pads 550 are attached to the bottom major surface of center section 925.

Folding of the assembly can, in general, be performed during a post-package assembly process or during board assembly. In some embodiments, the integrated waveguide assembly can be folded using a jig and then soldering or adhesively coupling the folded sections together. In other embodiments, the prefabricated waveguide assembly can be folded using a jig and then soldering or adhesively coupling the folded sections to the prefabricated waveguide block.

Figure 11:
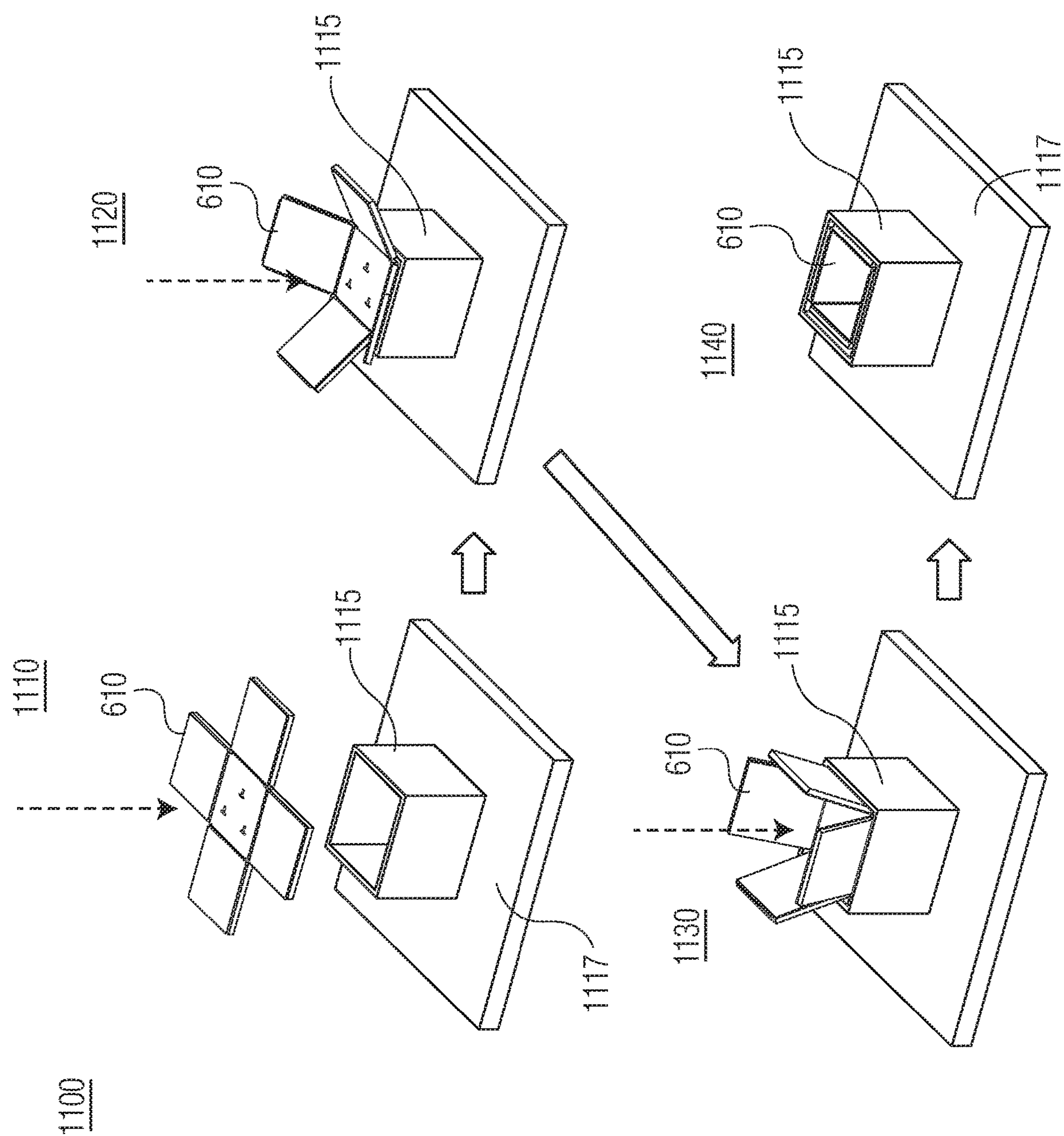
FIG. 11 is a simplified block diagram illustrating a series of steps that can be performed to fold the rigid-flex structure, for example, into a completed assembly, in accord with an embodiment of the present invention.

FIG. 11 is a simplified block diagram illustrating an alternative series of steps that can be performed to fold the rigid-flex structure of FIGS. 6A and 6B, for example, into a completed assembly, in accord with an embodiment of the present invention. A PCB board 1117 can include a folding collar 1115 in a location where the assembled waveguide structure is desired (1110). Rigid-flex structure 610 can be inserted into the folding collar (1120). As the rigid-flex structure is pushed further into the folding collar, the petal sections fold upward into an orthogonal position as compared to the center section (1130). Finally, rigid-flex structure 610 is completely inserted into folding collar 1115 such that any electrical contacts on the bottom surface of the center section of the rigid-flex structure are in contact with pads on PCB board 1117 (1140). It should be noted that a folding collar can be of any shape associated with a center section of a rigid-flex structure such as 610. Further, it should be noted that the sides of folding collar 1115 need not be orthogonal to a plane of PCB board 1117, but can be in an acute or obtuse angle with respect to the plane of the PCB board to provide a desirable waveguide structure for specific applications. The folding collar can be removed after assembly is performed, or the folding collar can remain as part of the assembly to provide, for example, mechanical or electromagnetic protection, or heatsinking the folded assembly (e.g., the folding collar can include fins on the outside to act as a heatsink).

Figure 12A:
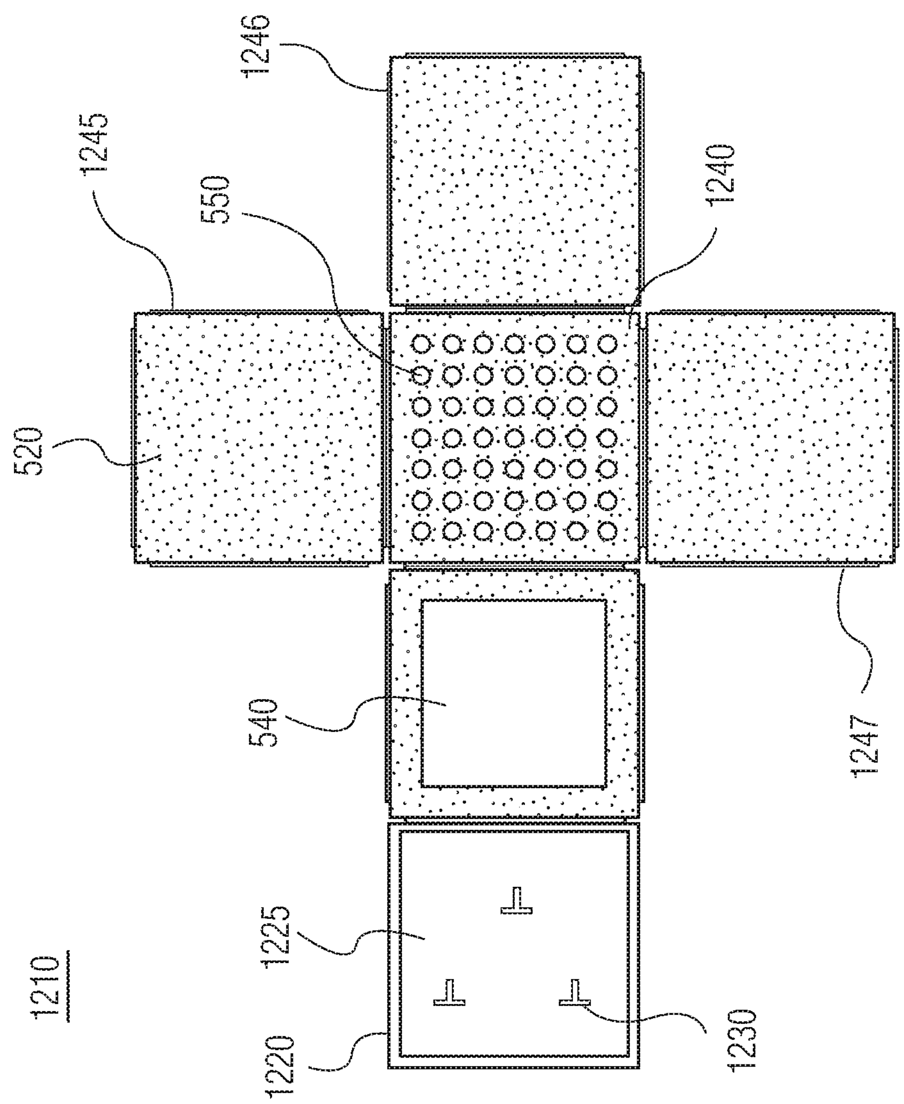
FIGS. 12A, 12B, and 12C are simplified block diagrams illustrating an alternative embodiment of a waveguide structure, in accord with embodiments of the present invention.
Figure 12B:
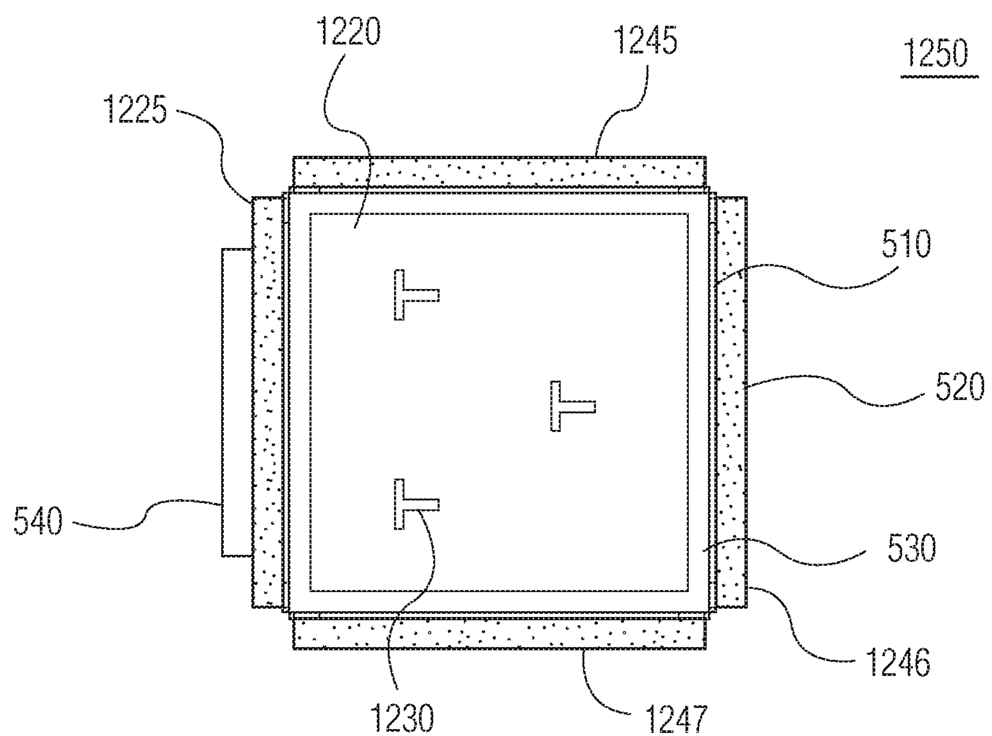
Figure 12C:
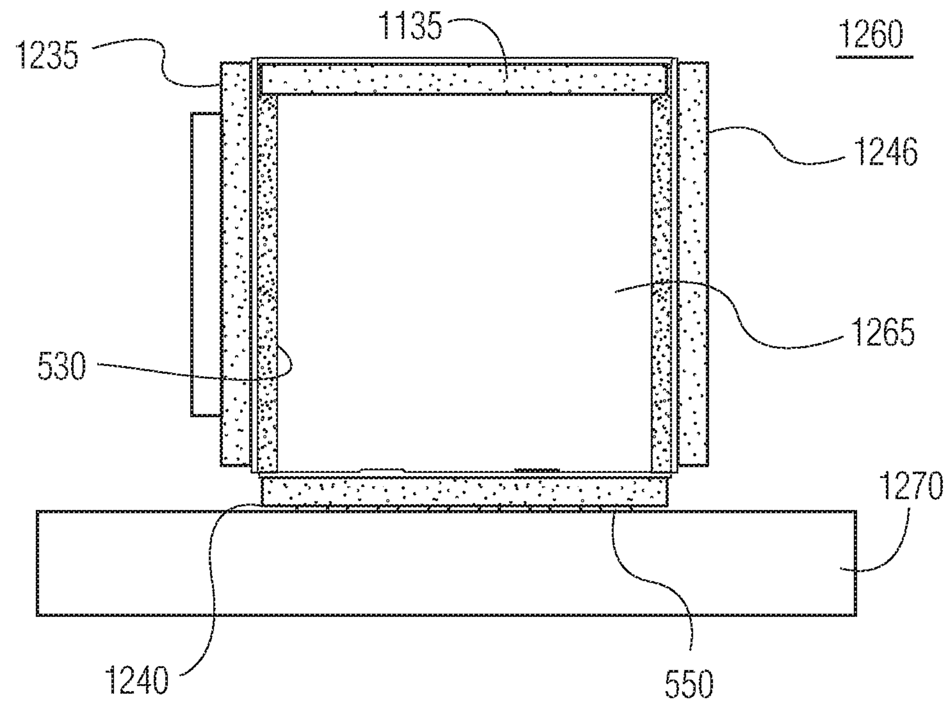

FIGS. 12A-12C are simplified block diagrams illustrating an alternative embodiment of a waveguide structure, in accord with embodiments of the present invention. In some applications, it can be desirable to have a reflector region beneath the antenna launchers. Embodiments can provide a rigid-flex PCB structure that can produce such a reflector region. First plan view 1210 in FIG. 12A illustrates a rigid-flex PCB structure having a section 1220 with an exposed flex PCB surface 1225 with antenna launchers 1230 mounted thereon. Neighboring section 1235 has an exposed rigid PCB surface with a semiconductor device die or package 540 mounted thereon. Neighboring section 1240 is a center section of the ultimately folded structure and therefore provides a set of interconnect pads 550 mounted on a rigid PCB surface. Three other petals 1245, 1246, and 1247 are joined to the remaining sides of the center section, each having exposed a rigid PCB material 520 in this plan view.

Top plan view 1250 in FIG. 12B illustrates the completed reflecting waveguide structure in a folded configuration. Section 1220 is shown on top of the box with the folded sides 1235, 1245, 1246, and 1247 beneath the antenna launcher bearing top surface. Semiconductor device die or package 540 is shown mounted to one of the sides of the box structure. Cross-section view 1260 in FIG. 12C illustrates the petals folded to an orthogonal position around the center section with the antenna launcher bearing surface 1220 on the top. Metallized surfaces of petal sections 1235, 1245, 1246, and 1247 and center section 1240 form a reflector cavity structure 1265 beneath the antenna launchers (petal sections 1245 and 1247 are not visible in the cross-section view but complete the closure of the cavity). Interconnect pads 550 provide contacts to a PCB board 1270 beneath the completed structure.

It should be noted that by the inclusion of additional petal type structures around section 1220, a waveguide structure can be formed around the upper surface of section 1220, if needed by the application.

Figure 13:
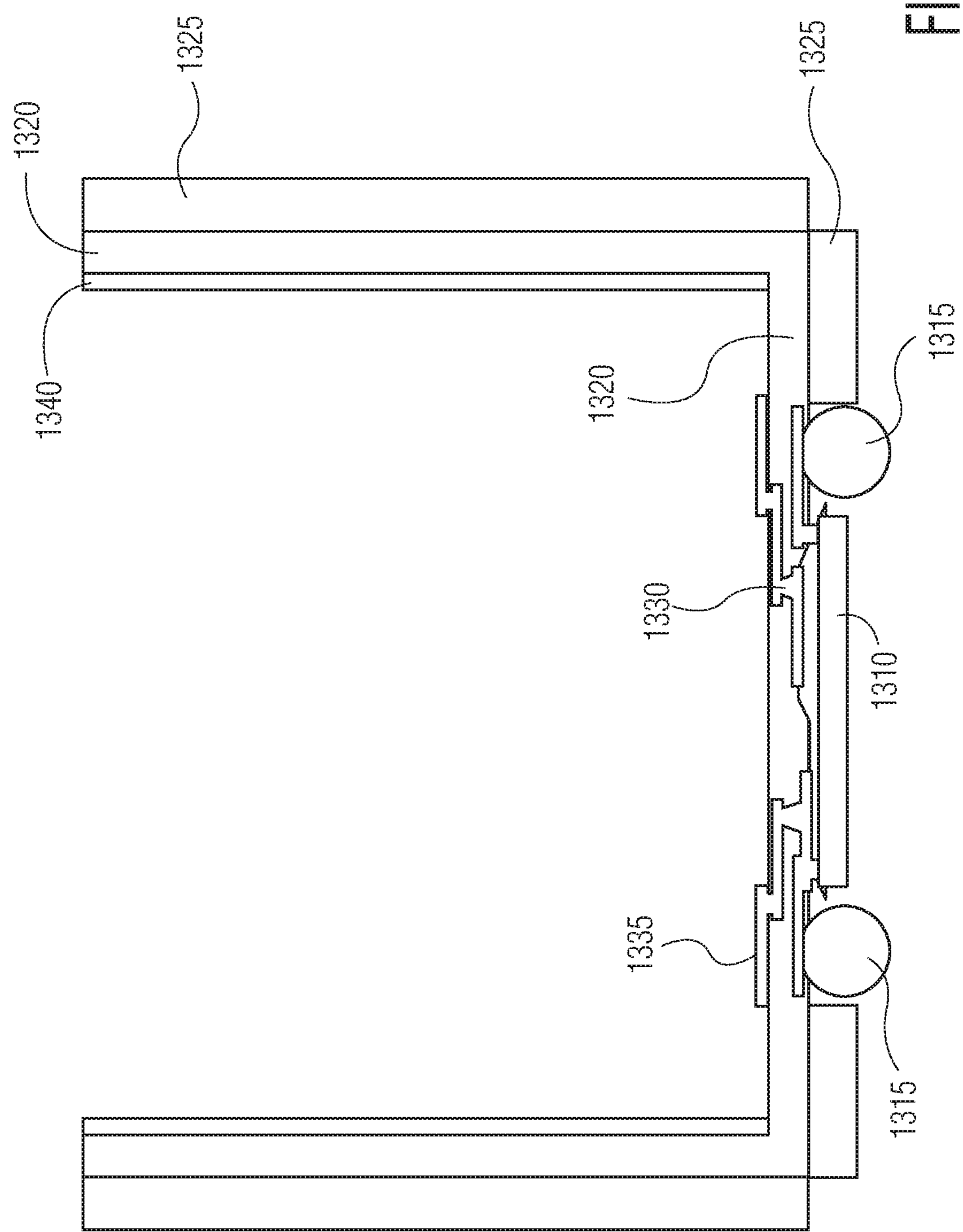
FIG. 13 is a simplified block diagram illustrating another example of a completed waveguide structure, in accord with embodiments of the present invention.

FIG. 13 is a simplified block diagram illustrating another example of a completed waveguide structure, in accord with embodiments of the present invention. In some applications, it is desirable to not have the height of completed waveguide structure be restricted by a dimension of the semiconductor device die or package. In such cases, the semiconductor device die/package can be mounted beneath the center section.

In FIG. 13, semiconductor device die/package 1310 is mounted on flex PCB substrate 1320 between interconnect pads 1315. By mounting the semiconductor device die/package on the flex PCB substrate, the die/package provides that region of the center section with rigidity. In addition, a portion of rigid PCB substrate 1325 can be formed or attached to flex PCB substrate 1320 to increase the rigidity. Traces 1330 are provided in metal layers of the flex PCB substrate to communicatively couple the semiconductor device die or package with antenna launchers 1335 and interconnect pads 1315. As with the above embodiments, waveguide 1340 can be either a metal layer formed or attached to flex PCB substrate 1320 or a prefabricated waveguide structure to which the flex PCB structure is attached. An additional advantage to this structure is that the communication path from the die or package to the antenna launchers is shorter than the communication path for embodiments mounting the die or package to one of the petal PCB structures. This reduces impedance and therefore can improve performance.

Figure 14A:
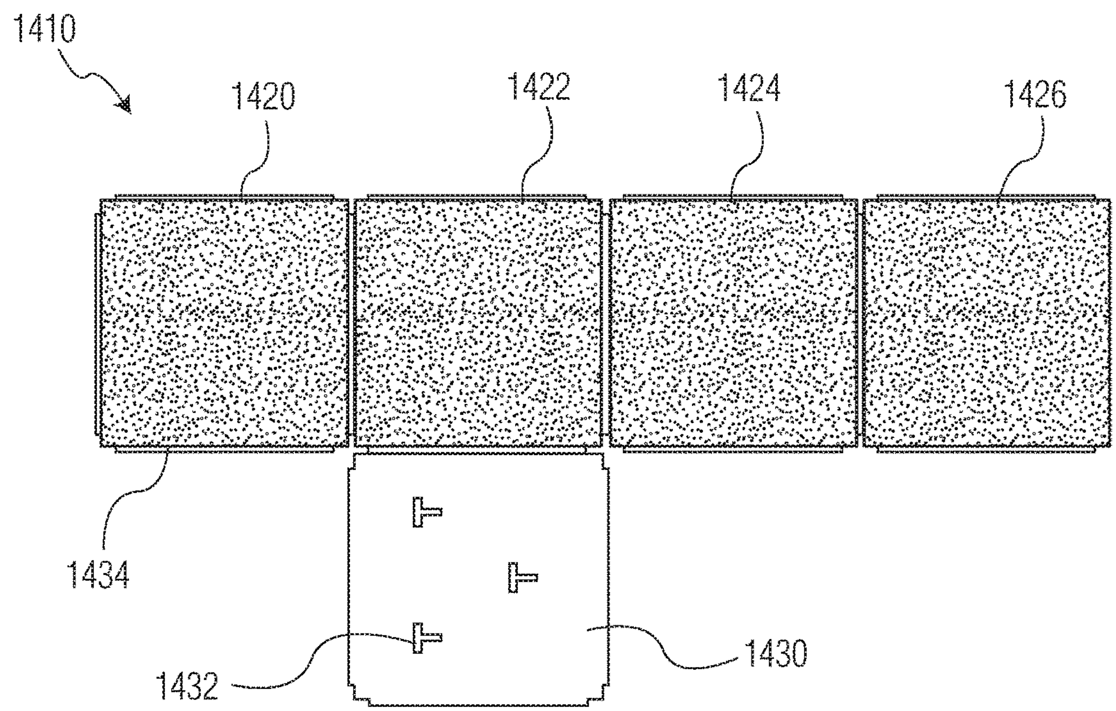
FIGS. 14A-D are simplified block diagrams illustrating an alternate example of a waveguide structure, in accord with embodiments of the present invention.

FIGS. 14A-14D are simplified block diagrams illustrating an alternate embodiment of a waveguide structure, in accord with embodiments of the present invention. In some applications, it can be desirable to have a waveguide cavity open to the side of the structure rather than the top of the structure, with the antenna launchers similarly positioned for transmission along a side direction. Upper plan view 1410 in FIG. 14A illustrates a rigid-flex PCB structure having a section 1430 with an exposed flex PCB substrate with antenna launchers 1430 mounted thereon. Section 1430 is flexibly coupled to section 1422 along a shared edge. Sections 1420 and 1424 are flexibly coupled to section 1422 along opposite free ends of section 1422. Further section 1426 is flexibly coupled to a free edge of section 1424 opposite section 1422. Sections 1420, 1422, 1424, and 1426 are illustrated with an exposed surface of a metal layer 1434.

Figure 14B:
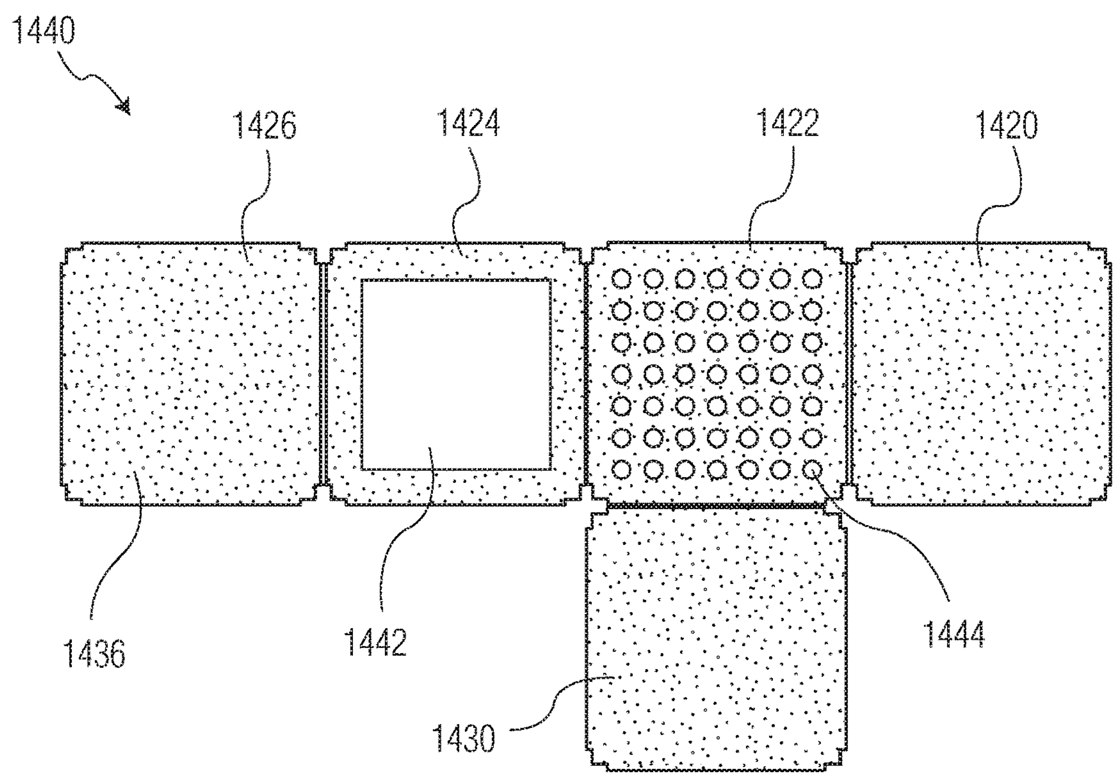

Lower plan view 1440 in FIG. 14B illustrates section 1422 exposing a surface of rigid PCB substrate 1436 with interconnect pads 1444 mounted thereon. Each section 1420, 1424, 1426, and 1430 are also illustrated with an exposed surface of rigid PCB substrate 1436. Petal 1424 is further illustrated with a semiconductor device die or package 1442 mounted thereon.

Figure 14C:
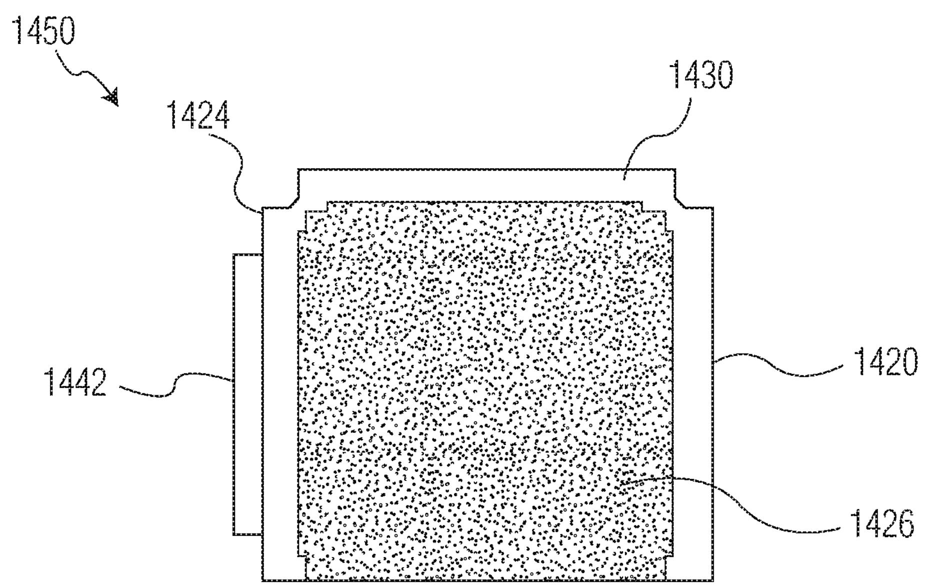
Figure 14D:
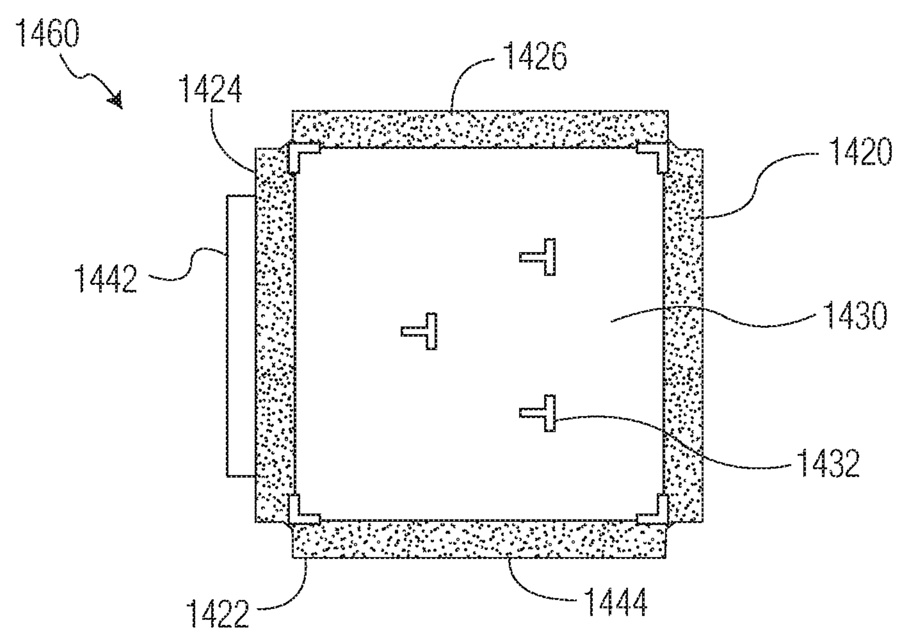

Top plan view 1450 in FIG. 14C illustrates the completed integrated waveguide rigid-flex structure in a folded configuration. Section 1426 is shown on top of the box with folded sides 1420, 1430, and 1424. Semiconductor device die or package 1442 is shown mounted to one of the sides of the box structure. Side view 1460 in FIG. 14D illustrates the cavity formed by the folded sides and the opening to the cavity is on side of the box being viewed. Metallized surfaces of sections 1420, 1422, 1424, and 1426 form a waveguide for antenna launchers 1432 on petal 1430. Interconnect pads 1444 can provide contacts to a PCB board beneath the completed structure (not illustrated). As with the previously discussed embodiments, the set of folded sections can be adhesively coupled to one another using an adhesive or soldering depending upon the application.

As discussed above, the use of a rigid-flex PCB structure to form a foldable package that provides a waveguide for antenna launchers can significantly reduce the area consumed by the structure. In addition, by mounting the associated semiconductor device die/package on the rigid-flex PCB structure, signal paths between the die/package and the antenna launchers can be significantly reduced, thereby improving impedance and signal loss issues.

By now it should be appreciated that there has been provided an integrated circuit package including a rigid-flex PCB structure, one or more antenna launchers coupled to the rigid-flex PCB structure, and a waveguide assembly including one or more metallized surfaces coupled to the rigid-flex PCB structure and configured to propagate electromagnetic waves emitted by the one or more antenna launchers.

In one aspect of the above embodiment, the rigid-flex PCB structure includes a first rigid PCB region, and one or more second rigid PCB regions coupled to corresponding edges of the first rigid PCB region at corresponding flexible PCB regions. In a further aspect, the metallized surface coupled to the rigid-flex PCB includes a metal layer applied to a top major surface of the one or more second rigid PCB regions. In a still further aspect, the metal layer is applied using plating. In another further aspect, the metal layer includes copper. In still another further aspect, the one or more antenna launchers are coupled to the top major surface of the first rigid PCB region. In a further aspect, one of the second PCB regions is oriented in a plane at an angle to the first rigid PCB region where the corresponding flex PCB region maintains electrical and physical coupling at the corresponding edges. In yet a further aspect, the angle is a 90° angle. In another aspect, each second rigid PCB region is oriented in a plane orthogonal to the first rigid PCB region, and each second rigid PCB region is adhesively coupled to each neighboring second rigid PCB regions at edges not corresponding to a flex PC region. In another aspect, the integrated circuit package further includes a semiconductor device die coupled to a bottom major surface of one of the one or more second rigid PCB regions, and a signal trace formed in the rigid-flex PCB coupling a signal pad of the semiconductor device die to the one or more antenna launchers.

In another aspect of the above embodiment, the one or more metallized surfaces coupled to the rigid-flex PC includes a hollow prism having open ends, and the hollow prism is adhesively coupled to the first rigid PCB region at a first open and of the hollow prism. In a further aspect, each of the one or more second rigid PCB regions are adhesively coupled along a major surface to a corresponding side of the hollow prism. In still another aspect of the above embodiment, the integrated circuit package further includes one or more interconnect pads coupled to a bottom major surface of the first rigid PCB region, and a second PCB electrically coupled to the rigid-flex PCBs structure using the one or more interconnect pads.

Another embodiment provides a method for forming an integrated circuit package having a waveguide. The method includes providing a rigid-flex piece substrate including a first rigid PCB region and second rigid PCB regions, forming an antenna launcher on the top major surface of the first rigid PCB region, and folding the second rigid PCB regions at the flexible PCB regions such that each second rigid PCB region is at a same angle to a plane defined by the first rigid PCB region. The first rigid PCB region has top and bottom major surfaces bounded by three or more edges and the second rigid PCB regions have top and bottom major surfaces bounded by four edges where an edge of each second rigid PCB region is coupled to a corresponding one of the edges of the first rigid PCB region by a flexible PCB region.

In one aspect of the above embodiment, the method further includes metallizing the top major surface of each of the second rigid PCB regions where the angle is less than 180° to the top major surface of the first rigid PCB region. In a further aspect, the angle is 90° to the top major surface of the first rigid PCB region and the method further includes adhesively coupling adjacent edges of the second rigid PCB regions.

In another aspect of the above embodiment, the method further includes metallizing the bottom major surface of each of the second rigid PCB regions where the angle is 270° to the top major surface of the first rigid PCB region, and adhesively coupling adjacent edges of the second rigid PCB regions.

In yet another aspect of the above embodiment, the method further includes providing a hollow prism having open ends where the hollow prism includes a same number of sides as the number of edges of the first rigid PCB region and a same cross-sectional area as the first rigid PCB region, and adhesively coupling an open end of the hollow prism to the top major surface of the first rigid PCB region. In a further aspect, folding the second rigid PCB regions includes folding the second rigid PCB regions such that the top major surface of each second rigid PCB region is in contact with a corresponding surface of the hollow prism. In a still further aspect, the method further includes adhesively coupling the top major surface of each second rigid PCB region to the corresponding side of the hollow prism.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

It is noted that in some embodiments, the active circuitry of die 540 may include a radio frequency (RF) block that implements an RF transmitter, an RF receiver, or both. In some embodiments, RF signals may be transmitted, received, or both, via an antenna on the resulting device (e.g., antenna launchers 560) that is communicatively coupled to the active circuitry of die 540 (e.g., through one or more external electrical connections between die 540 and antenna launcher 560). The RF block may implement front end components of the RF transmitter, RF receiver, or both, where the front-end components may include but are not limited to a transmitter power amplifier, a receiver low noise amplifier, one or more baluns, one or more filters, a circulator or other coupling device to the antenna, impedance matching elements, an oscillator, a phase locked loop, and other appropriate front-end elements. The front-end components of the RF block may have configurable settings to adjust the transmit signal or receive signal. In some embodiments, the RF block may have an operating frequency that falls within a frequency band of 300 to 500 MHz, although other operating frequencies that fall within other radio frequencies may be implemented in other embodiments.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Thus, it is to be understood that the structures depicted herein are merely exemplary, and that in fact many other structures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Although the invention is described herein with reference to specific embodiments, various modifications and changes can be made without departing from the scope of the present invention as set forth in the claims below. For example, a shape of center section 620 need not be a square, but can have three or more sides, as determined by the nature of the waveguide application. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit package comprising:
a rigid-flex PCB structure comprising:
a first rigid PCB region; and
one or more second rigid PCB regions coupled to corresponding edges of the first rigid PCB region at corresponding flexible PCB regions;
one or more interconnect pads coupled to a bottom major surface of the first rigid PCB region;
a second PCB electrically coupled to the rigid-flex PCB structure using the one or more interconnect pads;
one or more antenna launchers coupled to the rigid-flex PCB structure, wherein
the one or more antenna launchers are electrically coupled to radio frequency (RF) circuitry configured to provide an RF signal to the antenna launchers; and
a waveguide assembly comprising one or more metallized surfaces coupled to the rigid-flex PCB structure and configured to propagate electromagnetic waves emitted from the one or more antenna launchers, wherein the electromagnetic waves correspond to the RF signal.

2. The integrated circuit package of claim 1 wherein the metallized surface coupled to the rigid-flex PCB comprises a metal layer applied to a top major surface of the one or more second rigid PCB regions.

3. The integrated circuit package of claim 2 wherein the metal layer comprises copper.

4. The integrated circuit package of claim 2 wherein the one or more antenna launchers are coupled to the top major surface of the first rigid PCB region.

5. The integrated circuit package of claim 4 wherein one of the second rigid PCB region is oriented in a plane at an angle to the first rigid PCB region wherein the corresponding flex PCB region maintains electrical and physical coupling at the corresponding edges.

6. The integrated circuit package of claim 5 wherein the angle is a 90 degree angle.

7. The integrated circuit package of claim 4, wherein
each second rigid PCB region is oriented in a plane orthogonal to the first rigid PCB region;
each second rigid PCB region is adhesively coupled to each neighboring second rigid PCB regions at edges not corresponding to a flex PCB region.

8. The integrated circuit package of claim 4 further comprising:
a plurality of interconnect pads formed on the bottom major surface of the first rigid PCB region configured for solder ball attachment.

9. The integrated circuit package of claim 2 further comprising:
a semiconductor device die coupled to a bottom major surface of one of the one or more second rigid PCB regions;
a signal trace formed in the rigid-flex PCB coupling a signal pad of the semiconductor device die to the one or more antenna launchers.

10. The integrated circuit package of claim 1 wherein
the one or more metallized surfaces coupled to the rigid-flex PCB comprises a hollow prism having open ends, and
the hollow prism is adhesively coupled to the first rigid PCB region at a first open end of the hollow prism.

11. The integrated circuit package of claim 10 wherein each of the one or more second rigid PCB regions are adhesively coupled along a major surface to a corresponding side of the hollow prism.

12. A method for forming an integrated circuit package having a waveguide, the method comprising:
providing a rigid-flex PCB substrate comprising
a first rigid PCB region having top and bottom major surfaces bounded by three or more edges, and
second rigid PCB regions having top and bottom major surfaces bounded by four edges wherein an edge of each second rigid PCB region is coupled to a corresponding one of the edges of the first rigid PCB region by a flexible PCB region, wherein each of the edges of the first rigid PCB region is coupled to a separate one of the second rigid PCB regions;
forming an antenna launcher on the top major surface of the first rigid PCB region; and
folding the second rigid PCB regions at the flexible PCB regions such that each second rigid PCB region is at a same angle to a plane defined by the first rigid PCB region.

13. The method of claim 12 further comprising:
metallizing the top major surface of each of the second rigid PCB regions, wherein the angle is less than 180 degrees to the top major surface of the first rigid PCB region.

14. The method of claim 13 wherein the angle is 90 degrees to the top major surface of the first rigid PCB region and the method further comprises:
adhesively coupling adjacent edges of the second rigid PCB regions.

15. The method of claim 12 further comprising:
metallizing the bottom major surface of each of the second rigid PCB regions, wherein the angle is 270 degrees to the top major surface of the first rigid PCB region; and
adhesively coupling adjacent edges of the second rigid PCB regions.

16. The method of claim 12 further comprising:
providing a hollow prism having open ends, wherein the hollow prism comprises a same number of sides as the number of edges of the first rigid PCB region and a same cross sectional area as the first rigid PCB region; and
adhesively coupling an open end of the hollow prism to the top major surface of the first rigid PCB region.

17. The method of claim 16 wherein said folding the second rigid PCB regions comprises folding the second rigid PCB regions such that the top major surface of each second rigid PCB region is in contact with a corresponding surface of the hollow prism.

18. The method of claim 17 further comprising:
adhesively coupling the top major surface of each second rigid PCB region to the corresponding side of the hollow prism.

19. An integrated circuit package comprising:
a rigid-flex PCB structure comprising:
a first rigid PCB region; and
one or more second rigid PCB regions coupled to corresponding edges of the first rigid PCB region at corresponding flexible PCB regions;
a semiconductor device die coupled to a bottom major surface of one of the one or more second rigid PCB regions;

a signal trace formed in the rigid-flex PCB coupling a signal pad of the semiconductor device die to the one or more antenna launchers;

one or more antenna launchers coupled to the rigid-flex PCB structure, wherein the one or more antenna launchers are electrically coupled to radio frequency (RF) circuitry configured to provide an RF signal to the antenna launchers; and a waveguide assembly comprising one or more metallized surfaces coupled to the rigid-flex PCB structure and configured to propagate electromagnetic waves emitted from the one or more antenna launchers, wherein the metallized surface coupled to the rigid-flex PCB comprises a metal layer applied to a top major surface of the one or more second rigid PCB regions, and wherein the electromagnetic waves correspond to the RF signal.

20. The integrated circuit package of claim 19 wherein the one or more antenna launchers are coupled to the top major surface of the first rigid PCB region.

* * * * *